(12) United States Patent
Sze et al.

(10) Patent No.: US 8,878,601 B2
(45) Date of Patent: Nov. 4, 2014

(54) POWER SUPPLY CIRCUIT WITH POSITIVE AND NEGATIVE FEEDBACK LOOPS

(75) Inventors: Jhy-Jyi Sze, Hsin-Chu (TW); Biay-Cheng Hseih, Irvine, CA (US); Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/618,290

(22) Filed: Sep. 14, 2012

(65) Prior Publication Data

US 2013/0321073 A1 Dec. 5, 2013

Related U.S. Application Data

(60) Provisional application No. 61/653,775, filed on May 31, 2012.

(51) Int. Cl.
*G05F 1/10* (2006.01)
*G05F 1/46* (2006.01)

(52) U.S. Cl.
CPC ... *G05F 1/46* (2013.01); *G05F 1/10* (2013.01)
USPC ............................. 327/543; 327/540; 327/538

(58) Field of Classification Search
USPC ......................................................... 327/543
See application file for complete search history.

(56) References Cited

U.S. PATENT DOCUMENTS

| | | | | |
|---|---|---|---|---|
| 4,473,794 A | * | 9/1984 | Early et al. | 323/315 |
| 4,947,064 A | * | 8/1990 | Kim et al. | 327/262 |
| 5,079,518 A | * | 1/1992 | Wakayama | 330/288 |
| 5,521,490 A | * | 5/1996 | Manohar | 323/315 |
| 5,672,959 A | * | 9/1997 | Der | 323/273 |
| 5,867,015 A | * | 2/1999 | Corsi et al. | 323/316 |
| 6,191,453 B1 | * | 2/2001 | Petruzzello et al. | 257/350 |
| 6,373,231 B1 | * | 4/2002 | Lacey et al. | 323/268 |
| 6,556,069 B1 | * | 4/2003 | Casier et al. | 327/540 |
| 6,933,772 B1 | * | 8/2005 | Banerjee et al. | 327/541 |
| 7,319,314 B1 | * | 1/2008 | Maheshwari et al. | 323/313 |
| 7,714,645 B2 | | 5/2010 | Lin et al. | |
| 8,072,329 B1 | * | 12/2011 | Srinivas et al. | 340/572.1 |
| 8,427,204 B2 | | 4/2013 | Willey | |
| 8,476,967 B2 | * | 7/2013 | Kobayashi et al. | 327/543 |
| 2009/0091393 A1 | | 4/2009 | Quan et al. | |
| 2010/0084918 A1 | | 4/2010 | Fells et al. | |
| 2011/0273116 A1 | | 11/2011 | Kim | |
| 2012/0098574 A1 | * | 4/2012 | Morikawa | 327/103 |
| 2013/0119954 A1 | * | 5/2013 | Lo | 323/280 |

FOREIGN PATENT DOCUMENTS

| | | |
|---|---|---|
| KR | 20100080830 A | 7/2010 |
| KR | 1020110065552 A | 6/2011 |
| KR | 1020110122526 | 11/2011 |
| TW | 200924373 A | 6/2009 |
| TW | 201203862 A | 1/2012 |

* cited by examiner

*Primary Examiner* — Thomas J Hiltunen
(74) *Attorney, Agent, or Firm* — Slater & Matsil, L.L.P.

(57) ABSTRACT

A circuit includes a gate node, and a bias circuit coupled to the gate node. The bias circuit is configured to, in response to a change in a gate voltage on the gate node, provide a positive feedback to the gate voltage. A power circuit is coupled to the gate node, wherein the power circuit includes a power Metal-Oxide-Semiconductor (MOS) transistor. The power circuit is configured to, in response to a change in the gate voltage, provide a negative feedback to the gate voltage. An output node is coupled to the power circuit.

20 Claims, 1 Drawing Sheet

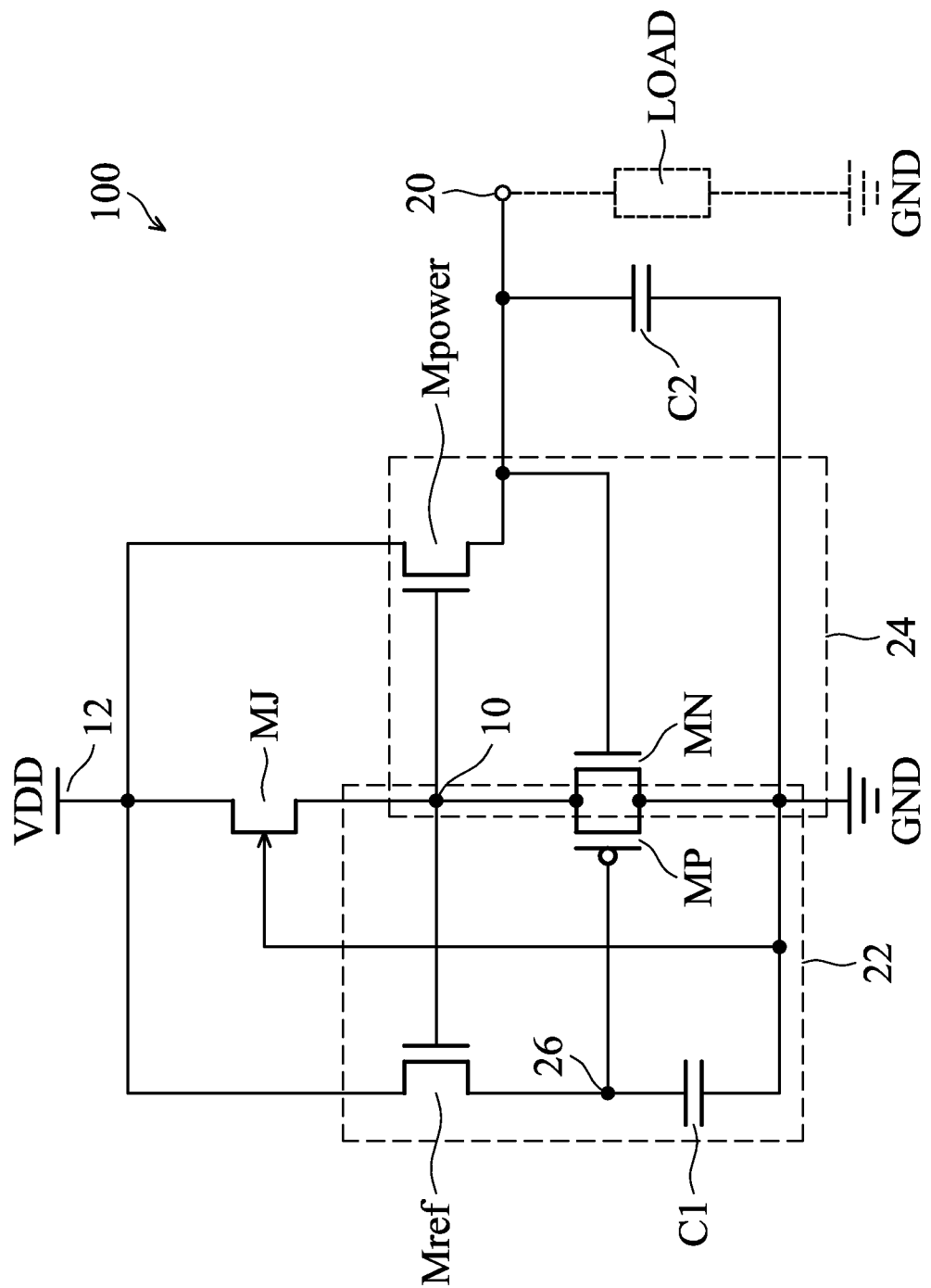

POWER SUPPLY CIRCUIT WITH POSITIVE AND NEGATIVE FEEDBACK LOOPS

This application claims the benefit of the following provisionally filed U.S. Patent application Ser. No. 61/653,775, filed May 31, 2012, and entitled "Power Supply;" which application is hereby incorporated herein by reference.

BACKGROUND

In integrated circuits, there are various types of devices, including logic devices, input/output (TO) devices, high-voltage devices, and the like. Different types of devices may require different power supply voltages. In an application that includes different types of devices, accordingly, a power supply circuit for converting one power supply voltage to another is needed.

In a power supply circuit, there may be a bias circuit to provide an appropriate bias voltage. A power device is biased by the bias circuit to work at a desirable state. The power device is typically large, so that it is able to provide large current needed by a load circuit.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates an exemplary circuit diagram of a power supply circuit, which includes a bias circuit forming a positive feedback loop and a power circuit forming a negative feedback loop.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A power supply circuit is provided in accordance with various exemplary embodiments. The variations and the operation of the embodiments are discussed. Throughout the various views and illustrative embodiments, like reference numbers are used to designate like elements.

FIG. 1 illustrates a circuit diagram of power supply circuit 100 in accordance with exemplary embodiments. Power supply circuit 100 includes power supply node 12, which receives positive power supply voltage VDD from a power supply voltage generation circuit (not shown). Positive power supply voltage VDD may be 2.8, 3.5V, or a higher or lower voltage. Power supply circuit 100 includes power circuit 24 for providing a current to load circuit LOAD, and bias circuit 22 for biasing the operation of power circuit 24. Bias circuit 22 and power circuit 24 are coupled to power supply node 12.

In some embodiments, bias circuit 22 includes transistor Mref and PMOS transistor Mp. Transistor Mref may be an n-type Metal-Oxide-Semiconductor (MOS) transistor, and hence is referred to as a MOS transistor hereinafter, although it may also be a bipolar transistor. The gate of MOS transistor Mref is connected to node 10, which has gate voltage VG. Accordingly, gate node 10 is also referred to as a gate node throughout the description. The source of MOS transistor Mref is coupled to a first capacitor plate of capacitor C1, and a second capacitor plate of capacitor C1 is coupled to electrical ground GND. Furthermore, the source of MOS transistor Mref is coupled to the gate of PMOS transistor MP. PMOS transistor MP has its source coupled to gate node 10, and its drain coupled to electrical ground GND. MOS transistor Mref and PMOS transistor Mp form a positive feedback loop. For example, when voltage VG on gate node 10 increases, MOS transistor Mref is more conductive, and hence voltage V26 on node 26 increases due to accumulation of charge on capacitor C1. The source-drain current of PMOS transistor MP is thus reduced, and hence voltage VG further increases. Conversely, when voltage VG on gate node 10 decreases, MOS transistor Mref is less conductive, and hence voltage V26 on node 26 decreases. The source-drain current of PMOS transistor MP is thus increased, and hence voltage VG further decreases. In alternative embodiments, the positive feedback loop in bias circuit 22 may be implemented through other circuit design.

Due to the positive feedback loop in bias circuit 22, bias circuit 22 may act as a startup circuit. When power supply circuit 100 is powered up, voltage VG is increased through the positive feedback, until a steady state is reached, at which time, bias circuit 22 continues to bias power circuit 24 to output current to output node 20.

In some exemplary embodiments, power circuit 24 includes transistor Mpower and NMOS transistor MN. Transistor Mpower may be an n-type MOS transistor, and hence is referred to as a MOS transistor hereinafter, although it may also be a bipolar transistor. MOS transistor Mpower is a power transistor, which has a large size in order to have an adequate driving capability. The drain of MOS transistor Mpower is coupled to power supply voltage VDD. The source of MOS transistor Mpower is coupled to output node 20. Furthermore, the source of MOS transistor Mpower is coupled to a first capacitor plate of capacitor C2, and a second capacitor plate of capacitor C2 is coupled to electrical ground GND. The source of MOS transistor Mpower may further be coupled to the gate of NMOS transistor MN. NMOS transistor MN has its drain coupled to gate node 10 to receive the gate voltage VG, and its source coupled to ground GND. MOS transistor Mpower and NMOS transistor MN thus form a negative feedback loop. For example, when voltage VG on gate node 10 increases, MOS transistor Mpower is more conductive, and hence output voltage Vout on output node 20 increases due to accumulation of charge on C2. Output voltage Vout is provided to the gate of NMOS transistor MN, and hence the source-drain current of NMOS transistor MN is increased. This results in voltage VG to decrease. Conversely, when voltage VG on gate node 10 decreases, MOS transistor Mpower is less conductive, and hence output voltage Vout on output node 20 decreases. Output voltage Vout is provided to the gate of NMOS transistor MN, and hence the source-drain current of NMOS transistor MN is reduced, which results in the increase in voltage VG. In alternative embodiments, the negative feedback loop in power circuit 24 may be implemented through other circuit design.

The combination of the positive feedback of bias circuit 22 and the negative feedback of power circuit 24 results in an improvement in the operation of power supply circuit 100. For example, assuming there is a large current sink to output node 20, causing output voltage Vout on output node 20 to decrease, through the negative feedback of power circuit 24, voltage VG on gate node 10 increases. The increase in voltage VG, on the other hand, simultaneously triggers the positive feedback loop of bias circuit 22. Through the positive feedback of bias circuit 22, the increased voltage VG is further increased. Accordingly, the gate-to-source voltage of power MOS transistor Mpower increases more, resulting in the desirable increase in the driving capability of power MOS transistor Mpower. Accordingly, with the simultaneous operation of the negative feedback loop and the positive feedback loop, output voltage Vout may quickly increase back to the normal value. Since the driving capability of power MOS transistor Mpower may be increased with the help of the positive feedback, there is no need to increase the size of power MOS transistor Mpower in order to increase the driving capability.

In some embodiments, transistors Mref and Mpower are of a same type of transistors such as Lateral Insulated Gate Bipolar Transistors (LIGBT). Transistors Mref and Mpower may also be power MOSFETs. Being of the same type, transistors Mref and Mpower may have similar characteristics, which is desirable for the operation of power supply circuit 100. MOS transistor Mpower supplies the current to load circuit LOAD, which draws current from output node 20. On the other hand, MOS transistor Mref provides the bias voltage for the operation of MOS transistor Mpower. Accordingly, MOS transistor Mref may have a size (such as the gate width) smaller than that of MOS transistor Mpower.

Power supply circuit 100 may further include a clamp circuit to clamp gate voltage VG, so that MOS transistors Mref and Mpower may be protected from dielectric breakdown. In some embodiments, the clamp circuit includes Junction gate Field-Effect Transistor (JFET) MJ, which may be an n-type JFET, although other types of MOS devices such as p-type JFETs may also be used. The gate of JFET MJ is coupled to ground GND, and hence is set to the ground voltage. Accordingly, the source voltage of JFET MJ, which is also voltage VG, is clamped to a voltage no higher than the pinch-off voltage Vpin of JFET MJ. When voltage VG increases and approaches voltage Vpin, JFET MJ starts to be turned off. Eventually, JFET MJ is fully turned off when voltage Vpin is reached, which limits the further increase of voltage VG.

In the embodiments, power supply circuit 100 receives input power circuit voltage VDD, and generates power supply voltage Vout that is lower than VDD. Through the actions of the bias circuit that forms the positive feedback loop and the power circuit that forms the negative feedback loop, the driving capability of the power circuit is increased. The bias circuit and the power circuit are protected by the clamp circuit, which limits the gate voltages of MOS transistors Mref and Mpower.

In accordance with embodiments, a circuit includes a gate node, and a bias circuit coupled to the gate node. The bias circuit is configured to, in response to a change in a gate voltage on the gate node, provide a positive feedback to the gate voltage. A power circuit is coupled to the gate node, wherein the power circuit includes a power MOS transistor. The power circuit is configured to, in response to a change in the gate voltage, provide a negative feedback to the gate voltage. An output node is coupled to the power circuit.

In accordance with other embodiments, a circuit includes a gate node, a power supply node, and a reference transistor having a first gate coupled to the gate node, a first drain coupled to the power supply node, and a first source. A PMOS transistor includes a second gate coupled to the first source, a second source coupled to the gate node, and a second drain coupled to an electrical ground. A power transistor includes a third gate coupled to the gate node, a third drain coupled to the power supply node, and a third source. An NMOS transistor includes a fourth gate coupled to the third source, a fourth drain coupled to the gate node, and a fourth source coupled to the electrical ground.

In accordance with yet other embodiments, a method includes, in response to a change in a gate voltage on a gate node, providing a positive feedback to the gate voltage through a positive feedback loop. The method further includes, in response to the change in the gate voltage, providing a negative feedback to the gate voltage through a negative feedback loop. A voltage in the negative feedback loop is output as an output voltage.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit comprising:
   a bias circuit coupled to a gate node, wherein the bias circuit is configured to, in response to a change in a gate voltage on the gate node, provide a positive feedback to the gate voltage, wherein the bias circuit comprises a PMOS transistor comprising a source coupled to the gate node and a drain coupled to an electrical ground; and
   a power circuit coupled to the gate node, wherein the power circuit comprises a power Metal-Oxide-Semiconductor (MOS) transistor, and wherein the power circuit is configured to, in response to the change in the gate voltage, provide a negative feedback to the gate voltage.

2. The circuit of claim 1 further comprising a clamp circuit configured to clamp the gate voltage.

3. The circuit of claim 2, wherein the clamp circuit comprises a Junction gate Field-Effect Transistor (JFET), and wherein the JFET comprises a source coupled to the gate node, and a drain coupled to a power supply node.

4. The circuit of claim 3, wherein the JFET further comprises a gate coupled to the electrical ground.

5. The circuit of claim 1, wherein the bias circuit further comprises:
   a reference transistor comprising a gate coupled to the gate node, a drain coupled to a power supply node, and a source, wherein the PMOS transistor comprises a gate coupled to the source of the reference transistor.

6. The circuit of claim 1, wherein the power circuit comprises:
   the power MOS transistor, wherein the power MOS transistor comprises a gate coupled to the gate node, a drain coupled to a power supply node, and a source connected to an output node of the power circuit; and
   an NMOS transistor comprising a gate coupled to the output node, a drain coupled to the gate node, and a source coupled to the electrical ground.

7. The circuit of claim 1, wherein the bias circuit comprises a first Lateral Insulated Gate Bipolar Transistor (LIGBT), wherein the power MOS transistor comprises a second LIGBT, and wherein the second LIGBT has a size greater than a size of the first LIGBT.

8. A circuit comprising:
- a reference transistor comprising a first gate coupled to a gate node, a first drain coupled to a power supply node, and a first source;
- a PMOS transistor comprising a second gate coupled to the first source, a second source coupled to the gate node, and a second drain coupled to an electrical ground;
- a power transistor comprising a third gate coupled to the gate node, a third drain coupled to the power supply node, and a third source; and
- an NMOS transistor comprising a fourth gate coupled to the third source, a fourth drain coupled to the gate node, and a fourth source coupled to the electrical ground.

9. The circuit of claim 8 further comprising:
- a first capacitor comprising a first capacitor plate coupled to the first source, and a second capacitor plate coupled to the electrical ground; and
- a second capacitor comprising a first capacitor plate coupled to the third source, and a second capacitor plate coupled to the electrical ground.

10. The circuit of claim 8 further comprising a Junction gate Field-Effect Transistor (JFET) comprising a drain coupled to the power supply node, and a source coupled to the gate node, wherein the JFET is configured to pinch off a voltage on the gate node.

11. The circuit of claim 10, wherein a gate of the JFET is coupled to the electrical ground, and is at a ground voltage.

12. The circuit of claim 8, wherein the reference transistor has a size smaller than a size of the power transistor.

13. The circuit of claim 8, wherein the reference transistor and the power transistor are NMOS transistors.

14. The circuit of claim 8, wherein the reference transistor and the power transistor are Lateral Insulated Gate Bipolar Transistors (LIGBTs).

15. A method comprising:
- in response to a change in a gate voltage on a gate node, providing a positive feedback to the gate voltage through a positive feedback loop, wherein the positive feedback is provided through a bias circuit comprising a PMOS transistor, and wherein a source of the PMOS transistor receives the gate voltage;
- in response to the change in the gate voltage, providing a negative feedback to the gate voltage through a negative feedback loop; and
- outputting a voltage in the negative feedback loop as an output voltage.

16. The method of claim 15, wherein the bias circuit further comprises a reference transistor, wherein a gate of the reference transistor receives the gate voltage, and wherein a source of the reference transistor is coupled to a gate of the PMOS transistor.

17. The method of claim 15, wherein the negative feedback is provided through a power transistor and an NMOS transistor, wherein a gate of the power transistor and a drain of the NMOS transistor receive the gate voltage, and wherein a source of the power transistor is coupled to a gate of the NMOS transistor.

18. The method of claim 15 further comprising, in response to the change in the gate voltage, clamping the gate voltage using a clamp circuit.

19. The method of claim 18, wherein the gate voltage is clamped using a Junction gate Field-Effect Transistor (JFET), and wherein the gate voltage is clamped at no higher than a pinch-off voltage of the JFET.

20. The method of claim 15, wherein the positive feedback and the negative feedback are provided to the gate voltage simultaneously.

* * * * *